United States Patent [19]

Barrett et al.

[11] Patent Number: 5,611,955
[45] Date of Patent: Mar. 18, 1997

[54] HIGH RESISTIVITY SILICON CARBIDE SUBSTRATES FOR HIGH POWER MICROWAVE DEVICES

[75] Inventors: Donovan L. Barrett, Penn Hills Twp.;
Hudson M. Hobgood, Murrysville;
James P. McHugh, Wilkins Twp.;
Richard H. Hopkins, Murrysville, all of Pa.

[73] Assignee: Northrop Grumman Corp., Los Angeles, Calif.

[21] Appl. No.: 138,566

[22] Filed: Oct. 18, 1993

[51] Int. Cl.[6] ............................................. C04B 35/565
[52] U.S. Cl. .................... 252/62.3 C; 117/951; 437/100; 148/DIG. 148; 148/33; 252/516; 501/88
[58] Field of Search ................................ 252/62.3 C, 516; 117/951; 437/100; 148/DIG. 148, 33; 501/88

[56] References Cited

U.S. PATENT DOCUMENTS

| | | | |
|---|---|---|---|
| 2,854,364 | 9/1958 | Lely | 148/1.5 |
| 3,236,780 | 2/1966 | Ozarow | 117/951 |
| 3,520,740 | 7/1970 | Addaminao | 148/175 |
| 3,546,032 | 12/1970 | Basart | 252/62.3 C |
| 3,956,032 | 5/1976 | Powell et al. | 148/175 |
| 4,147,572 | 4/1979 | Vodakov et al. | 252/62.3 C |
| 4,866,005 | 9/1989 | Davis et al. | 437/100 |
| 5,200,805 | 4/1993 | Parsons et al. | 252/62.3 C |
| 5,211,801 | 5/1993 | Stein | 156/603 |

FOREIGN PATENT DOCUMENTS 59-3017  1/1984  Japan ................... 252/62.3 C

OTHER PUBLICATIONS

Kendall "J. Chem. Phys.", vol. 21, No. 5; 1953.
"Investigation of Growth Processes of Ingots of Silicon Carbide Single Crystals" by Yu. M. Tairov and V. F. Tsvetkov, Journal of Crystal Growth 43 (1978) 209–212.
Chem. Ab. 112:188186, Schneider et al, from: Appl. Phys. Lett. (Apr. 1990), 56(12), 1184–86.
Chem. Ab. 121:23633, Il'in et al, 1990*.
Chem. Ab. 115:267646, Ballandovich, 1991*.
Chem Ab. 108:66827, Litvin et al, 1987*.
Tairov et al, "Investigation of Silicon Carbide Single Crystals Doped With Scandium", Phys. Stat. Sol. (a), 25, pp. 340–357, 1974, no month.

Primary Examiner—Melissa Bonner
Attorney, Agent, or Firm—Philip A. Florenzo

[57] ABSTRACT

A substrate for use in semiconductor devices, fabricated of silicon carbide and having a resistivity of greater than 1500 Ohm-cm. The substrate being characterized as having deep level impurities incorporated therein, wherein the deep level elemental impurity comprises one of a selected heavy metal, hydrogen, chlorine and fluorine. The selected heavy metal being a metal found in periodic groups IIIB, IVB, VB, VIB, VIIB, VIIIB, IB and IIB.

13 Claims, 1 Drawing Sheet

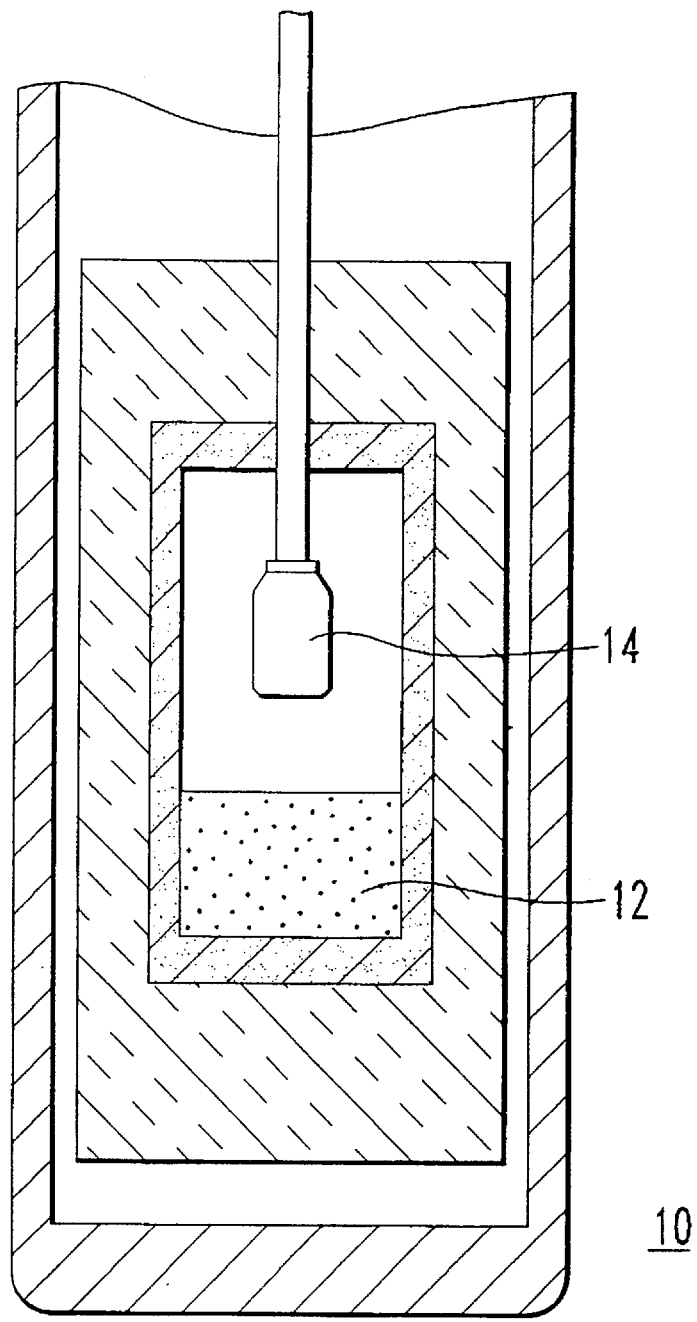

HIGH RESISTIVITY SILICON CARBIDE SUBSTRATES FOR HIGH POWER MICROWAVE DEVICES

BACKGROUND OF THE INVENTION

1. Field of the Invention

The present invention relates to methods for producing silicon carbide semiconductor substrates having high resistivity.

2. Description of the Prior Art

Silicon carbide exhibits many attractive electrical and thermophysical properties for the fabrication of high power density solid state devices operating at microwave frequencies. Silicon carbide based microwave transistors and integrated circuits may provide approximately five times the power density of gallium arsenide MMICs at X band, and approximately ten times the power density of silicon at UHF to S band frequency.

Compared to mature silicon and GaAs device technologies, silicon carbide is a relatively new technology. However, recent advances in the growth of large diameter silicon carbide substrates and the realization of silicon carbide's superior temperature, thermal conductivity, and electric field breakdown properties have prompted intensive research efforts to develop silicon carbide based electronic materials and devices extensively throughout the industry.

The silicon carbide devices currently being produced have power gains limited well below their theoretical performance by parasitic conduction and capacitive losses in the substrates. Calculations indicate that 1500Ω-cm substrate resistivity represents a minimum threshold value to achieve RF passive behavior. Also, 5000Ω-cm resistivity is needed to minimize device transmission line losses to 0.1db/cm or less. To ensure device isolation and to minimize backgating effects, resistivities approaching semi-insulating behavior (in the range of $5 \times 10^4$ Ω-cm or higher) are the goal.

Efforts date back at least as far as U.S. Pat. No. 2,854,364 to Lely for producing device quality silicon carbide.

Many efforts have been made in recent years to produce large, device quality single crystals of silicon carbide. One attempt at growth by sublimation is described in U.S. Pat. No. 4,866,005 to Davis et al. Davis et al. do not disclose the production of highly resistive silicon carbide substrates.

It is known that impurities can be introduced as dopants into semiconductor materials. These incorporated elements give certain properties such as electrical conductivity and conduction type to the semiconductor, respectively. Furthermore, it is known in the art that impurities can be added to some other semiconductor materials to obtain high resistivity characteristics. For example, chromium is doped (incorporated) into gallium arsenide (GaAs) to achieve semi-insulating behavior. However, techniques used to produce semi-insulating behavior in GaAs are not applicable to silicon carbide, since they rely on introducing the dopant (chromium) by addition to a melt of liquid GaAs at relatively low temperatures (the melting point of GaAs 1238° C. or lower, compared to the growth temperatures for SiC in excess of 2000° C.). Incorporation of the chromium relies upon the high diffusivity of the impurity in the liquid GaAs and impurity segregation effects between the solid and liquid phase during solidification. These effects are not applicable to SiC since no liquid SiC state exists at practicably realizable pressures. (SiC sublimes directly from the solid phase without passing through a liquid state.) Furthermore, the exceedingly low diffusion coefficients of impurities in SiC prohibit incorporation of impurities by diffusion directly into the SiC solid.

SUMMARY OF THE INVENTION

We provide a high resistivity, microwave grade silicon carbide material that is particularly suitable for use as a substrate. The process for producing the substrate creates semi-insulating electrical behavior in the substrate by the formation of energy levels lying deep within in the forbidden energy band (band gap) of the silicon carbide. In this invention, these energy levels are referred to as deep levels and consist of energy states lying at least 300 meV away from the conductor or valence band edges. For better control of the deep level formation and for higher resistivity, very high purity silicon carbide is utilized as the source material. The formation of deep levels in the forbidden band involves the controlled introduction of selected elements (either selected heavy metals or passivating elements such as hydrogen, chlorine or fluorine) or combinations of elements into the silicon carbide to form deep level centers in the silicon carbide.

Other objects and advantages of the invention will become apparent from a description of the present preferred embodiment thereof shown in the drawings.

BRIEF DESCRIPTION OF THE DRAWINGS

FIG. 1 shows a schematic of a furnace for producing low loss, high resistivity silicon carbide substrate material.

DETAILED DESCRIPTION OF THE PREFERRED EMBODIMENT

Although the description of the semiconductor material formation will be provided for a single 6H polytype silicon carbide crystal grown by sublimination with the axis of the crystal oriented along the <0001> c-direction, it is understood that the process may also be conducted with other polytypes, such as 2H, 4H or 15R and for crystal orientations other than c-axis, such as a-axis <1210>. Additionally, chemical vapor deposition (CVD) or other known means may be employed to grow the crystal.

The controlled growth of high purity silicon carbide 6H single crystals is preferably produced in a typical ultra clean (impurity free) physical vapor transport furnace, such as is schematically depicted in FIG. 1. Any heating means such as a resistive heating element may be utilized for heating the furnace. An ultra clean environment for crystalline growth is preferably established. The ultra clean environment is obtained by providing hot zone components made using ultra purified graphite and carbon parts or parts consisting of other high purity refractories or coatings. A high vacuum pumping system (not shown) may also be employed for high speed degassing of the hot zone components prior to and during growth. In addition to the ultra clean environment, a silicon carbide sublimation source consisting of feed stock synthesized from high purity Si and C elements (or compounds containing Si and C) is used. Furthermore, ultra pure inert ambient gas such as Ar or He is used during growth as a protective environment in the furnace.

Deep level elemental impurities are incorporated by introducing these impurities during the high temperature sublimination or CVD growth of the high purity silicon carbide crystals. Vanadium and selected other heavy metals introduce a near-mid-band gap energy level. In addition, nonmetallic impurities (such as hydrogen, chlorine and fluorine) may serve as passivating traps for shallow residual impurities. Also, the growth of crystals in a chlorine containing ambient can lead to significantly higher as-grown resistivities as well.

Thus, silicon carbide substrate material having high resistivity semi-insulating properties can be formed by incorporating deep level elemental impurities during the sublimation growth of high purity silicon carbide crystals, through systematically introducing candidate elements into the high purity silicon carbide charge or in the form of selected organometallic compounds, as well as by growth in passivating gaseous ambient containing halogens such as chlorine, fluorine or hydrogen.

It is known in semiconductor technology that to make semiconductor material conducting, the carrier electrons must be excited to a high energy state so they can become mobile and travel through the semiconductor material. Also, in a given semiconductor material only a certain range of energies are available to the carrier electrons, with those energies that are not available being called the energy gap or the forbidden band of the semiconductor. Impurities may be introduced into the semiconductor material such that carrier electrons may occupy various states within the energy band of the semiconductor material.

The present invention introduces elements into the semiconductor material which create deep levels (energy states within the forbidden energy gap) of the semiconductor. Atoms of the selected impurity create deep levels (energy states) within the forbidden region and can act as trapping centers and compensation centers for the carriers (electrons and holes) of the semiconductor material. By trapping or compensating any mobile carriers, the elemental impurities can cause the material to have a high resistivity and act as a semi-insulator.

Elements that may act as deep level impurities if incorporated in the semiconductor material include selected "heavy metal" elements from groups IIIB, IVB, VB, VIB, VIIB VIII, IB and IIB from the periodic chart. The electronic structure of these elements, i.e., being heavier elements having many shells of electrons, makes them potential suitable choices for use as deep level impurities.

Another group of elements that may be introduced into the semiconductor material during formation of the substrate to achieve high resistivity in the substrate include hydrogen, chlorine, and fluorine. As opposed to using heavy metals as the impurity which change the electrical properties of the silicon carbide, hydrogen, chlorine, and fluorine act as electrically passivating impurities for the silicon carbide. Their presence provides electrical activity which compensates electrical activity associated with conducting surface states of the silicon carbide.

EXAMPLE

High resistivity silicon carbide crystals have been achieved using elemental vanadium as the metallic dopant. Vanadium was chosen as the dopant element based on the hypothesis that vanadium incorporation in silicon carbide would create deep-level electronic states within the energy gap. These deep-level states could then act as deep donors or acceptors in the compensation of electrically active shallow impurities. The effect of the compensation would be to cause high resistivity (i.e. semi-insulating behavior) in silicon carbide. The reduction to practice was carried out in the following way:

Vanadium-doped silicon carbide single crystals of 6H-polytype were grown in the c-<0001>axial direction with diameters up to 50-mm and lengths up to 75-mm using the physical vapor transport (PVT) technique. The growth technique utilized a sublimation furnace (FIG. 1) in which high purity graphite materials constituted the hot-zone of the furnace. The PVT growth proceeded by sublimation of a vanadium-doped silicon carbide source (held at a temperature of approximately 2300° to 2400° C.) and deposition of the vapor species upon a high quality 6H on carbide monocrystalline seed wafer (held at a temperature of 2100° to 2200° C.). The growth rate was controlled by ambient partial pressure, seed to source $\Delta T$, and temperature gradient at the solid-vapor interface. For our vanadium-doped crystal, the growth rate varied between 0.75 and 1.1 mm-hr$^{-1}$. The crystal was grown in a 20 Torr, high purity Argon ambient provided by the boil-off of ultra-high purity liquid Argon.

The vanadium-doped silicon carbide used for the sublimation source was prepared in the following way. High purity silicon carbide powder with elemental impurities less than 10 ppm wt. was used as the sublimination source. High purity (99.999%) vanadium metal was mixed with the high purity silicon carbide source powder. In our experiments, the total weight of the source powder was 600 g to which approximately 2.5 g of five nines pure elemental vanadium was added.

During the crystal growth, the partial pressure of argon was maintained at 20 Torr; the temperature of the seed was held at 2190° to 2220° C.; the temperature of the subliming vanadium-doped source was held at 2300° to 2350° C.; the seed to source temperature gradient $\Delta T$ was maintained between 110° and 130° C.

The resulting vanadium-doped crystal exhibited a vanadium-content between 300 and 1000 ppm wt. as determined by glow discharge mass spectrometry. Absorption measurements performed on wafers sliced from the front, middle and end of the crystal show that the vanadium was incorporated uniformly throughout the grown crystal (within a factor of two). Differential infrared-absorption measurements further show that the Fermi level is pinned on the vanadium deep-donor level, located at approximately 1 eV below the conduction band edge. The conductivity of the crystal was below the detection limits of conventional measurement equipment. Calculations of the resistivity of the crystal, based on the estimated position of the Fermi level, suggest that resistivities greater than $10^5\Omega$-cm should result from vanadium doping, i.e., the crystal should have the properties of a semi-insulator. Electrical measurements utilizing high impedance van der Pauw techniques confirmed a resistivity of greater than $10^7\Omega$-cm for the vanadium-doped SiC crystal produced according to the present invention.

While certain present preferred embodiments have been shown and described, it is distinctly understood that the invention is not limited thereto but may be otherwise embodied within the scope of the following claims.

We claim:

1. A composition of matter for use in semiconductor devices, fabricated of single polytype silicon carbide and having a resistivity of at least 1500$\Omega$-cm, the matter being characterized as having deep level dopants incorporated therein;

wherein the deep level dopants are at a depth at least about 300 meV and include a selected heavy metal; and wherein the selected heavy metal is an element found in periodic groups IIIB, IVB, VB, VIB, VIIB, VIIIB, IB and IIB.

2. The substrate of claim 1 wherein the deep level dopants are at least one of an element: and a combination of elements.

3. The substrate of claim 1 wherein the selected heavy metal is vanadium.

4. The matter of claim 1 wherein the dopant is incorporated during sublimation growth of the silicon carbide.

5. The matter of claim 1 wherein the dopant is incorporated during chemical vapor deposition of the silicon carbide.

6. The matter of claim 1 wherein the silicon carbide polytype is one of 2H, 4H, 6H and 15R.

7. A composition of matter for use in semiconductor devices, fabricated from a single polytype of silicon carbide including deep level vanadium at a depth at least about 300 meV and having a resisivity of at least 1500Ω-cm, wherein the vanadium is between 300 and 1000 ppm wt.

8. A composition of matter for use in semiconductor devices, fabricated of single polytype silicon carbide and having a resistivity of at least 1500Ω-cm, the matter being characterized as having deep level dopants incorporated therein, wherein the deep level dopants are at a depth of at least 300 meV and act as compensators.

9. The matter of claim 8 wherein the dopant is incorporated during sublimation growth of the silicon carbide.

10. The matter of claim 8 wherein the dopant is incorporated during chemical vapor deposition of the silicon carbide.

11. The matter of claim 8 wherein the silicon carbide polytype is one of 2H, 4H, 6H and 15R.

12. A composition of matter for use in semiconductor devices comprised of a silicon carbide semiconductor material having deep level dopants at a depth of at least 300 meV and a resistivity of at least $5\times10^4$Ω-cm, wherein the dopants include an element found in periodic groups IIIB, IVB, VB, VIB, VIIB, VIIIB, IB and IIB.

13. The composition of matter in claim 12 wherein the silicon carbide semiconductor material is semi-insulating.

* * * * *